(12) United States Patent
Miyahara et al.

(10) Patent No.: US 6,698,347 B2
(45) Date of Patent: Mar. 2, 2004

(54) SCREEN PRINTING APPARATUS AND METHOD OF SCREEN PRINTING

(75) Inventors: Seiichi Miyahara, Fukuoka (JP); Kimiyuki Yamasaki, Fukuoka (JP); Takahiro Fukagawa, Fukuoka (JP); Kunihiko Tokita, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 135 days.

(21) Appl. No.: 10/006,973

(22) Filed: Dec. 4, 2001

(65) Prior Publication Data

US 2002/0088354 A1 Jul. 11, 2002

(30) Foreign Application Priority Data

Dec. 5, 2000 (JP) ........................................ 2000-369580

(51) Int. Cl.⁷ .................................................. B41L 13/18
(52) U.S. Cl. ........................ 101/123; 101/129; 118/213
(58) Field of Search ................................. 101/119, 120, 101/123, 129; 118/213, 301, 406, 667, 712

(56) References Cited

U.S. PATENT DOCUMENTS 3,994,683 A * 11/1976 Zimmer et al. ................. 8/444
5,287,806 A * 2/1994 Nanzai ......................... 101/123
5,925,187 A * 7/1999 Freeman et al. ............. 118/667

FOREIGN PATENT DOCUMENTS

JP            347635        * 12/2001

* cited by examiner

Primary Examiner—Ren Yan
(74) Attorney, Agent, or Firm—RatnerPrestia (57) ABSTRACT

Cream solder stored in a squeegee head is pressurized by a pressurizing plate, and the squeegee head is slid on a mask plate, so that the cream solder is printed onto a substrate via pattern apertures. This is done by a screen printing apparatus, in which pressurized solder is accommodated, and the solder is brought into contact with a surface of the mask plate via an opening formed on a lower face of the cell. A rectifier is disposed in the cell for blocking the cream solder from flowing into a specific area just above the opening. This structure allows the solder to flow into the opening in a slant direction, and causes the solder to roll. This mechanism prevents the solder from being hardened due to staying stagnant just above the opening, and thus prevents defective printings.

5 Claims, 7 Drawing Sheets

SCREEN PRINTING APPARATUS AND METHOD OF SCREEN PRINTING

FIELD OF THE INVENTION

The present invention relates to a screen printing apparatus which prints paste, e.g., cream solder or conductive paste, onto a substrate, and a method of the screen printing. More particularly, it relates to a novel squeegee head of the apparatus. The head can maintain fluidity of the paste and prevent defective printing due to hardened paste, and the method of screen printing using the same apparatus.

BACKGROUND OF THE INVENTION

In an electronics-part-mounting process, a screen printing is employed for printing cream solder or conductive paste onto substrates. In this screen printing method, a mask plate—having pattern apertures corresponding to the places to be printed—is placed over a substrate, and paste is printed onto the substrate through the pattern apertures with a squeegee head.

An airtight squeegee head has been used in a conventional squeegee method. This method is different from a regular screen printing, and it does not supply paste directly onto a mask plate, but employs a squeegee head in which paste is stored. With this method, a paste-contacting face provided beneath the squeegee head is brought into contact with a mask plate, and pressure is applied to the paste in the squeegee head, so that the paste is pushed into the pattern apertures of the mask plate via the paste-contacting face. Then the squeegee head is slid on the mask plate for filling each of the pattern apertures with the paste sequentially.

However, this screen printing using the conventional airtight squeegee head has had the following problems: In the airtight squeegee head, the paste is always applied pressure during the printing operation. The paste thus gradually loses fluidity and is hardened with the lapse of pressurizing time because granular component densely included in the paste is urged to each other. If such hardened paste is supplied onto the mask plate via the lower face of the squeegee head, the paste cannot be normally pushed into the pattern apertures. As a result, defective printings such as blur are produced. The conventional airtight squeegee head tends to incur defective printings due to the paste hardened by pressure.

SUMMARY OF THE INVENTION

The present invention addresses the problem discussed above and aims to provide a screen printing apparatus and a method of screen printing, both of which can prevent defective printings due to hardened paste.

The screen printing apparatus of the present invention slides a squeegee head on a mask plate, and prints paste on substrates via pattern apertures of a mask plate. The apparatus comprises a squeegee head, and the head includes the following elements:

(a) a paste storage for storing paste;
(b) a pressure applying member for applying pressure to the paste stored in the paste storage;
(c) a paste cell for accommodating pressurized paste and bringing the paste into contact with a surface of the mask plate via an opening formed on a lower face of the cell;
(d) a scraper for forming a brim of the opening of the cell by contacting with the surface of the mask plate at its lower end, and having slopes forming a front and a rear walls in a squeegee direction; and
(e) a paste-flow adjusting member for flowing the pressurized paste into the opening in a slant direction by blocking a flow into an area just above the opening, the adjusting member being disposed in the paste cell.

A screen printing method of the present invention prints the paste on substrates via pattern apertures of a mask plate by sliding a squeegee head on the mask plate, this method comprises the steps of:

(a) applying pressure to the paste in the storage disposed in the squeegee head;
(b) accommodating the paste in the paste cell having the opening at its lower face, and bringing the paste into contact with the surface of the mask plate;
(c) blocking the paste from flowing into an area just above the opening with the paste-flow adjusting member disposed in the paste cell, and flowing the paste into the opening in a slant direction.

The apparatus and the method discussed above allow the paste to maintain its fluidity, and prevent defective printings due to hardened paste.

BRIEF DESCRIPTION OF THE DRAWINGS

FIG. 4, FIG. 5A and FIG. 5B are partial sectional views of a squeegee head of the screen printing apparatus shown in FIG. 1. (FIG. 5A illustrates a case where the head has no rectifier.)

DESCRIPTION OF THE PREFERRED EMBODIMENTS

Preferred embodiments of the present invention are demonstrated hereinafter with reference to the accompanying drawings.

First Exemplary Embodiment

Figure 1:
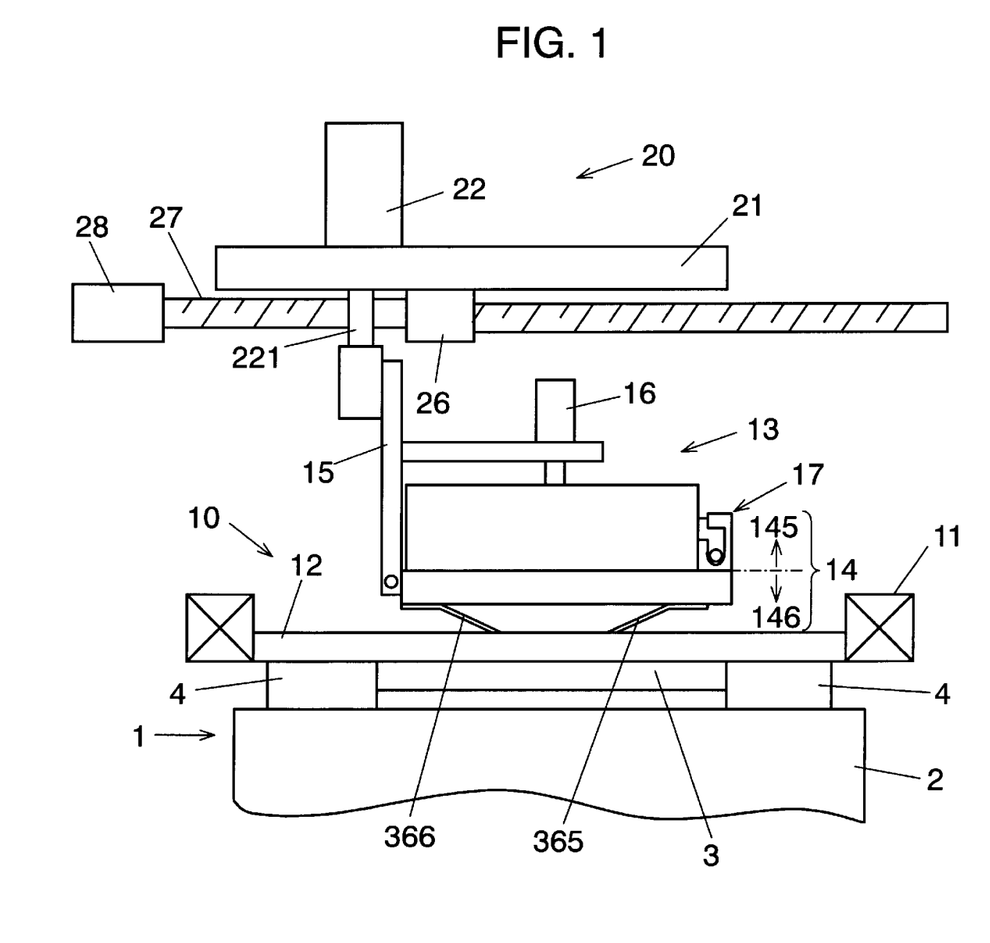
FIG. 1 is a front view of a screen printing apparatus in accordance with a first exemplary embodiment of the present invention.
Figure 2:
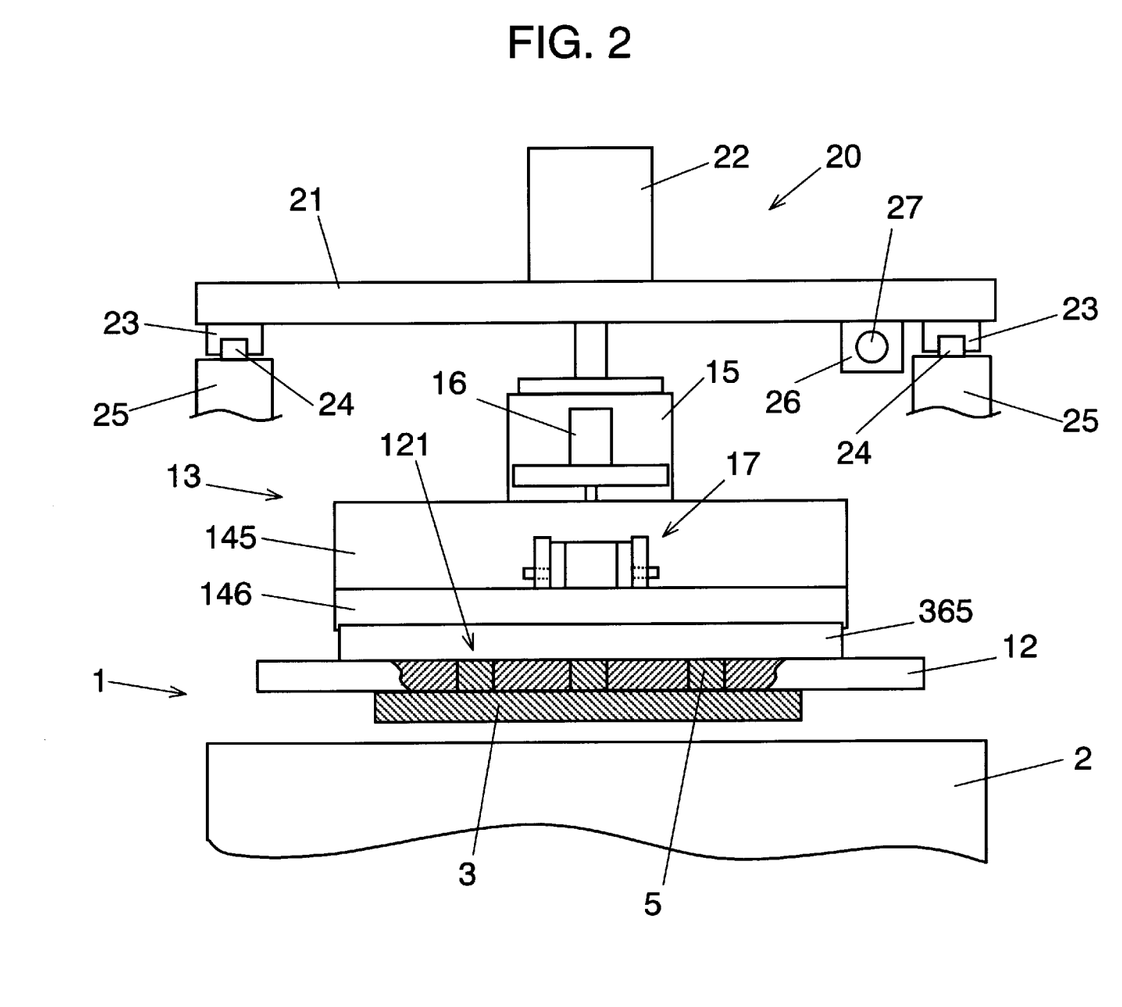
FIG. 2 is a lateral view of the screen printing apparatus shown in FIG. 1.
Figure 3:
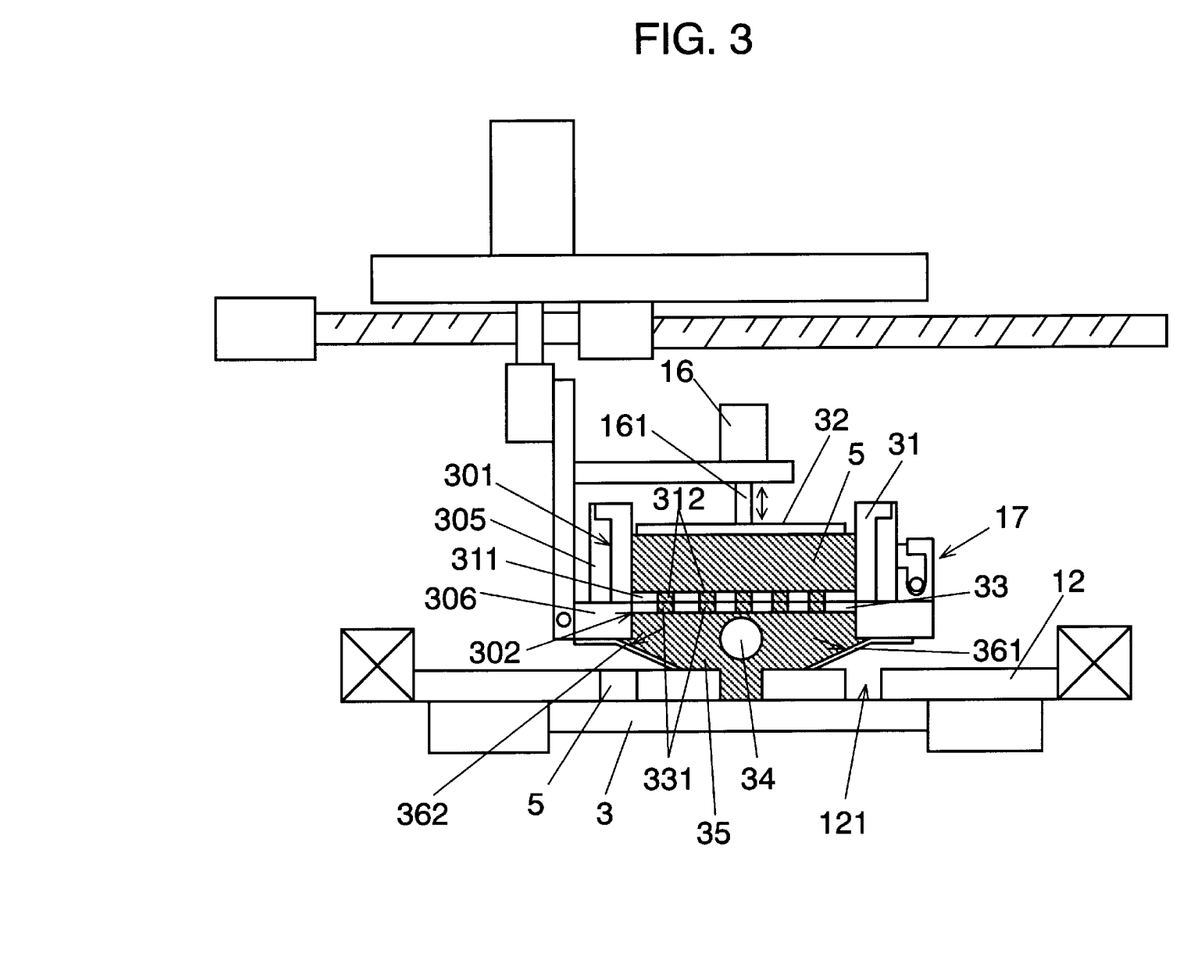
FIG. 3 is a partial sectional view of the screen printing apparatus shown in FIG. 1.
Figure 4:
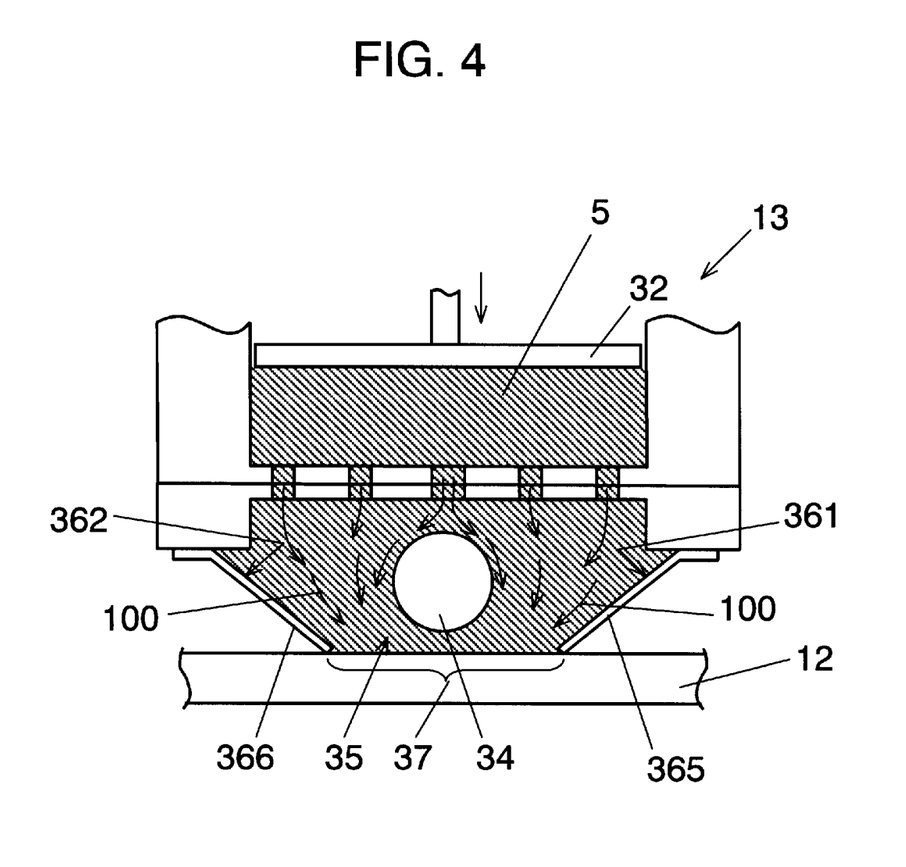
Figure 5A:
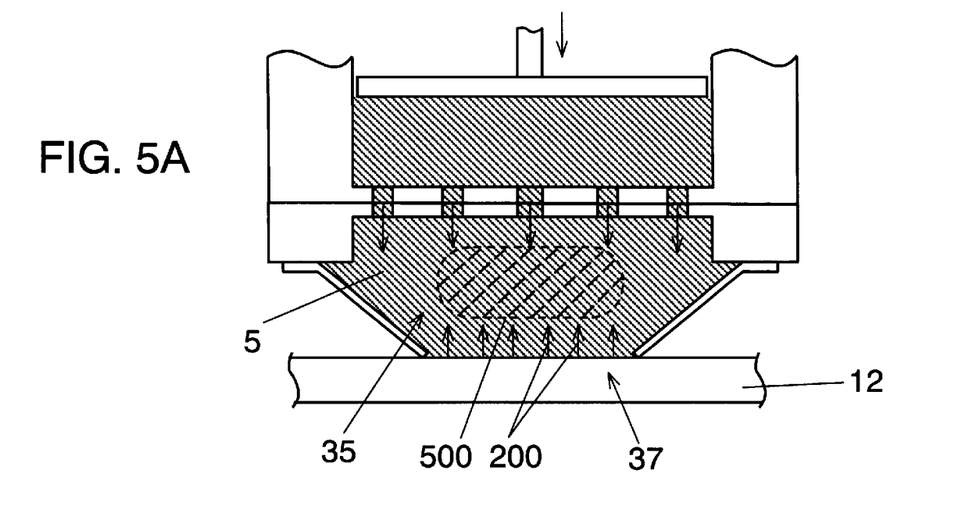
Figure 5B:
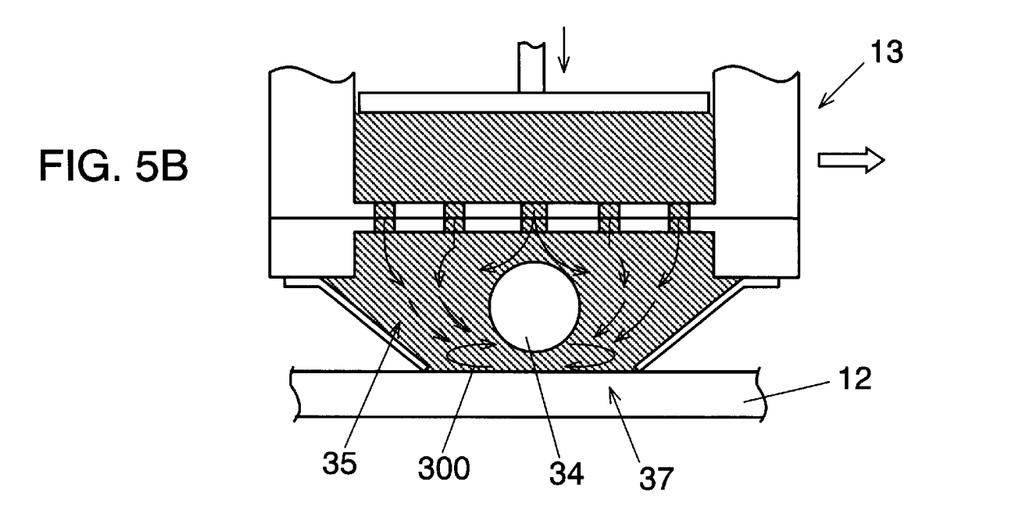
Figure 6A:
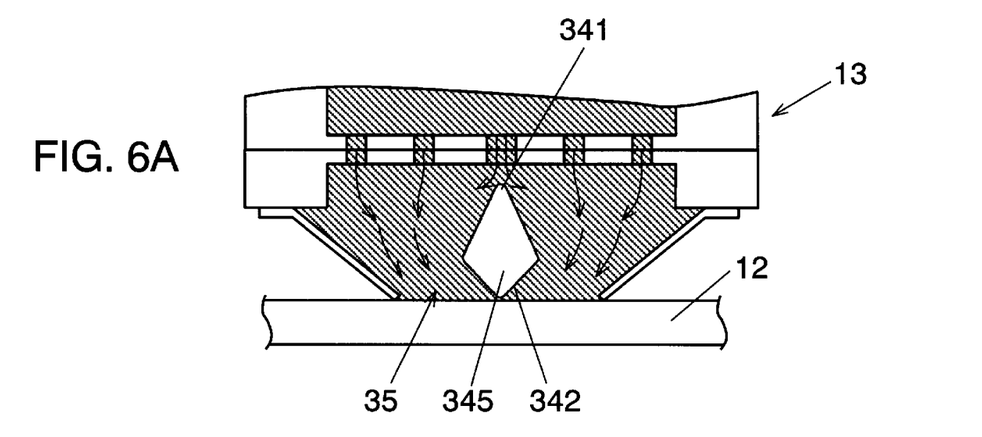
FIG. 6A and FIG. 6B are partial sectional views of another squeegee head of the screen printing apparatus in accordance with the first embodiment of the present invention.
Figure 6B:
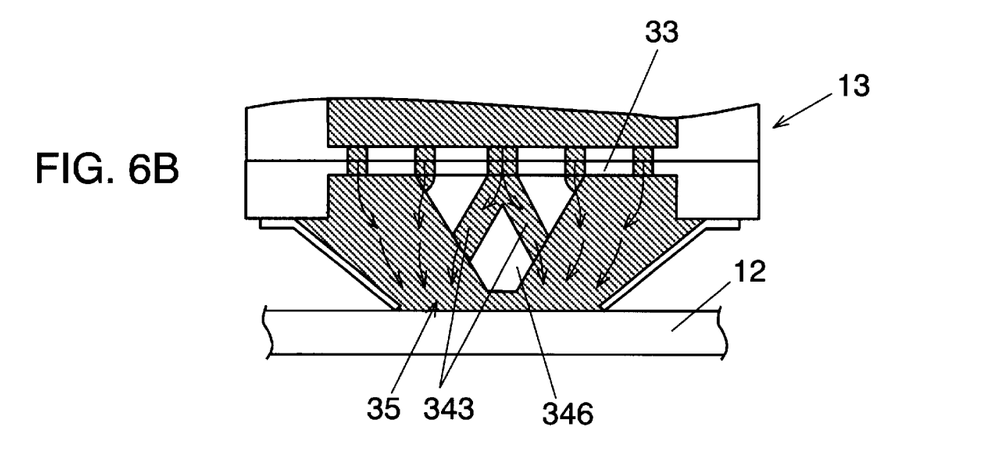

FIG. 1 is a front view of a screen printing apparatus in accordance with a first exemplary embodiment of the present invention. FIG. 2 is a lateral view of the same apparatus shown in FIG. 1. FIG. 3 is a partial sectional view of the same apparatus. FIG. 4, FIG. 5A and FIG. 5B are partial sectional views of a squeegee head of the screen printing apparatus shown in FIG. 1. FIG. 5A illustrates a case where the head has no rectifier. FIG. 6A and FIG. 6B are partial sectional views of another squeegee head.

First, a structure of the screen printing apparatus is described with reference to FIG. 1, FIG. 2 and FIG. 3. In FIG. 1 and FIG. 2, substrate positioning section 1 disposes substrate holder 2 on a moving table (not shown.) Substrate 3 to be printed is held by clamp 4 of holder 2, and positioned horizontally and vertically by driving the moving table.

Above positioning section 1, disposed is screen mask 10 which mounts mask plate 12 at holder 11. Mask plate 12 has pattern apertures 121 corresponding to printing places on substrate 3. Above mask 10, disposed is squeegee head 13 which can be moved by head lift 20. Lift 20 is equipped with cylinder 22 standing on plate 21.

Head 13 is coupled to a lower section of rod 221 of cylinder 22 via coupler 15. Driving cylinder 22 raises and lowers head 13 with respect to mask plate 12. In other words, lift 20 functions as lifting means for raising and lowering head 13 with respect to mask 10.

Beneath the lower face of plate 21, fixed are sliders 23 at both ends of plate 21. Both sliders 23 are fit to guide rails 24 disposed on upper face of frame 25 in a sidable manner. Beneath the lower face of plate 21, fixed is nut 26 with which feed screw 27 engages. Feed screw 27 is driven by motor 28.

Driving motor 28 moves plate 21 horizontally, which causes head 13 to move also horizontally. With head 13 lowered, motor 28 is driven, thereby moving head 13 horizontally on mask plate 12. In other words, motor 28, screw 27 and nut 26 form moving means for moving head 13 horizontally on mask plate 12.

Head 13 includes printing section 14, which fills pattern apertures 121 with paste, i.e., cream solder 5, contacting with the surface of mask plate 12. Printing section 14 is divided into upper portion 145 and lower portion 146. As shown in FIG. 3, upper portion 145 and lower portion 146 include respectively upper body 305 and lower body 303, both having more width than height widthwise of mask plate 12 and being stacked up one on top another like blocks. The length of upper body 305 and lower body 306 cover the width of substrate 3. Hinge 17 couples upper body 305 to lower body 305, so that both the elements can be opened or closed.

On upper body 305, formed is recess 301, to which cartridge 31 is detachably mounted. Cartridge 31 stores cream solder 5 in a given amount and functions as a storage (paste storage), and is mounted to upper body 305 in printing. Pressurizing plate 32 is fit to an opening formed on upper side of cartridge 31 for applying pressure to solder 5 stored inside cartridge 31. Plate 32 is coupled to rod 161 of cylinder 16 disposed above the cylinder. Driving cylinder 16 moves pressurizing plate 32 in cartridge 31 up and down.

The bottom plate of cartridge 31 functions as a flow-through plate 311 for solder 5. Numbers of apertures 312 are provided to plate 311. Pressurizing plate 32 is pressed down by cylinder 16, so that solder 5 in cartridge 31 is pressurized. Solder 5 is pushed out through apertures 312, in other words, cylinder 16 and pressurized plate 32 function as pressurizing means for applying pressure to solder 5.

On the other hand, lower body 306 includes overall opening 302 that communicates with inside of cartridge 31. At an upper section of opening 302, cling-preventive plate 33 solidly contacts with flow-through plate 311. Cling-preventive plate 33 has round apertures 331 corresponding to apertures 312 formed on flow-through plate 311. Plate 33 prevents solder 5 from clinging to the bottom plate of cartridge 31, in other words, solder 5 pushed-out flows down in cartridge 31 and is prevented by plate 33 from clinging to the places other than apertures 312 on the lower face of flow-through plate 311.

Pushed-out solder 5 arrives at paste cell 35 which is a space formed by scrapers 365, 366—both extending in a tapered manner from the bottom plate of lower body 306— and the bottom plate of lower body 306. A bottom section of cell 35 is opening 37 (refer to FIG. 4) having scrapers 365 and 366 as a brim. In cell 35 and just above opening 37, disposed is cylindrical rectifier 34 having a round sectional view, and rectifier 34 adjusts the flow of solder 5 in cell 35. This adjusting function is detailed later.

Scrapers 365 and 366 have respective slopes 361 and 362 that form front and rear walls of cell 35 in squeegee direction. With squeegee head 13 lowered, lower ends of scrapers 365 and 366 are brought into contact with the surface of mask plate 12. In printing, cell 35 accommodates pressurized cream solder 5, and brings solder 5 into contact with the surface of mask plate 12 through opening 37 formed between scrapers 365 and 366.

Pressurizing plate 32 is pressed down for applying pressure to solder 5 in cartridge 31, so that solder 5 goes through flow-through plate 311 and cling-preventive plate 33, then moves into cell 35. Numbers of small apertures 312 and 331 narrow the cross sectional areas of paths of solder 5. Viscosity of solder 5 is lowered by passing pressurized-solder 5 through these apertures, and is thus improved for screen printing.

Movement of solder 5 in cell 35 is demonstrated with reference to FIG. 4. As shown in FIG. 4, when solder 5 moves downward in cell 35, rectifier 34 blocks solder 5 from flowing into a specific area, i.e., the area just above opening 37. This structure forces solder 5 to go around rectifier 34 to get opening 37, and slopes 361 and 362 restrict the flow direction so that solder 5 flows slantingly into opening 37 as arrow marks 100 indicate. The flow-in direction is restricted to a slant direction as shown in FIG. 4, and solder 5 thus cannot flow in from above opening 37.

The meaning of restricting the flow-in direction of solder 5 into opening 37 is described with reference to FIG. 5A and FIG. 5B. FIG. 5A illustrates how solder 5 moves if no rectifier exists in cell 35. In this squeegee head, when pressurized solder 5 moves downward in cell 35, compressive force is applied to the solder arrived at specific area 500 just above opening 37. To be more specific, the pressurized solder—moving downward and transmitting the pressure— applies compressive force downward, and the solder—being pushed back upward by reactive force (arrow marks 200) produced by urging the squeegee head against mask plate 12—applies compressive force upward. These downward and upward compressive forces are applied to the solder existing at specific area 500.

These compressive forces work continuously during the printing operation, therefore, within cell 35, solder 5 at specific area 500 is more hardened with the laps of time than that of at the other areas. This hardened area 500 blocks the flow-in of solder 5 from surrounding area of opening 37. As a result, this mechanism causes defective printings such as blur.

In squeegee head 13 shown in FIG. 5B in accordance with the first embodiment, rectifier 34 is placed at the place corresponding to specific area 500 described in FIG. 5A. Solder 5 existing at the surrounding area of rectifier 34 is thus not hardened, and solder 5 going around rectifier 34 flows into opening 37 in a slant direction.

As shown in FIG. 5B, the area above opening 37 is a rolling area where the flow (refer to arrow marks 300) in a rotational direction of solder 5 is generated by squeegee movement, i.e., movement of head 13 relative to mask plate 12. Solder 5 flowing in slantingly tends to be drawn into the rolling area and flows in the rotational direction. In other words, rectifier 34 blocks the flow-in of solder 5 into specific area 500, so that pressurized solder 5 flows into opening 37 in the slant direction, namely, rectifier 34 functions as a paste-flow adjusting member.

Cream solder 5 is pressurized by pressurizing plate 32, so that cell 35 is filled with solder 5 having a viscosity changed to an adequate one. Then cell 35 slides on mask plate 12. Pattern apertures 121 of mask plate 12 between scrapers 365 and 366 are filled with solder 5 in cell 35 by this sliding. In this squeegee operation, since rectifier 34 is placed in cell 35, solder 5 is never hardened at the lower section of cell 35. As a result, defective printings due to hardened solder 5 can be prevented.

Head 13 is further moved for filling respective pattern apertures 121 with solder 5 sequentially. When each of the apertures 121 is filled with solder 5, substrate holder 2 is lowered for releasing substrate 3 from mask plate 12. In other words, solder 5 in apertures 121 and substrate 3 are lowered together leaving apertures 121 behind, so that the screen printing of solder 5 onto substrate 3 is completed.

In this embodiment, a member having a round sectional view is used as rectifier 34; however, a member having a transformed diamond-shaped sectional view as rectifier 345 shown in FIG. 6A can be used as a rectifier. In rectifier 345, a top vertical angle at summit 341 forms an acute-angle, and bottom vertical angle at bottom 342 forms an obtuse-angle. Summit 341 is shaped acute for smoothing the flow of solder 5 from above, and the bottom 342 is subject to reactive force produced by urging solder 5 existing above opening 37 downward.

In the example shown in FIG. 6B, a triangular prism facing its summit downward is used as rectifier 346, which is placed such that it contacts with a lower face of cling-preventive plate 33. As the sectional view of rectifier 346 illustrates, solder path 343 is formed downward in rectifier 346, so that solder 5 flowing out of opening 331 can move to the lower section of cell 35 with ease. This structure produces the same advantage as discussed above.

A method of screen printing—using the screen printing apparatus in accordance with this first embodiment—is demonstrated hereinafter.

The printing method is this: Squeegee head 13 is slid on mask plate 12, so that the paste (cream solder 5) is printed onto substrate 3 via pattern apertures 121 of mask plate 12. This method comprises the following steps:

(a) pressurizing the paste in a paste storage (cartridge 31) disposed in head 13;

(b) accommodating the pressurized paste in paste cell 35 of which lower face has opening 37, and bringing the paste into contact with a surface of mask plate 12; and (c) blocking the paste from flowing into a specific area just above opening 37 with a paste-flow adjusting member (rectifier 34) disposed in cell 35, and flowing the paste into opening 37 in a slant direction.

This method prevents the paste from being hardened, and defective printings in the screen printing can be avoided.

Second Exemplary Embodiment

Figure 7A:
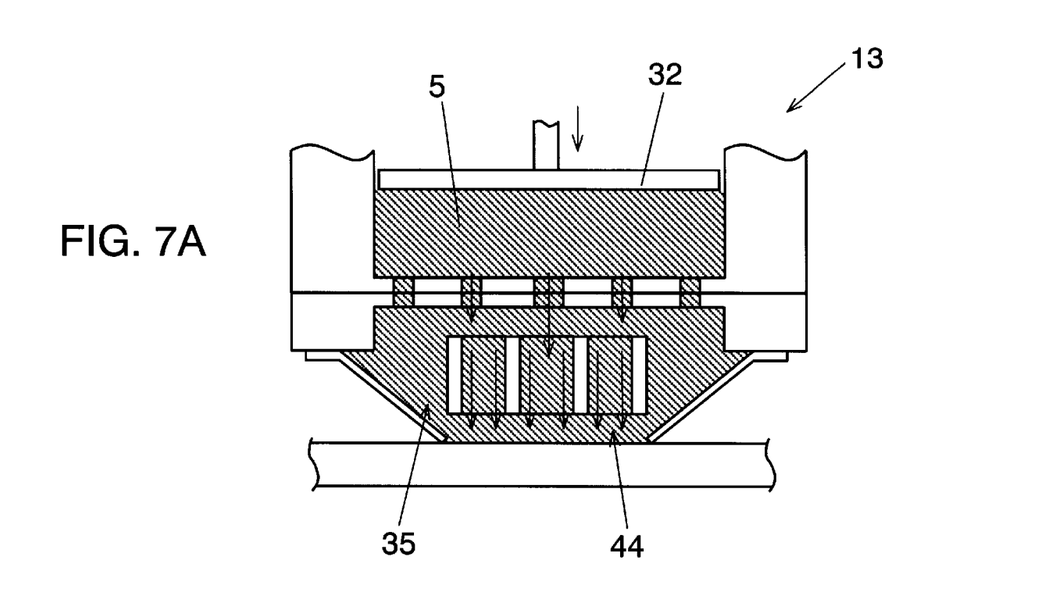
FIG. 7A is a partial sectional view of a squeegee head of a screen printing apparatus in accordance with a second exemplary embodiment of the present invention.
Figure 7B:
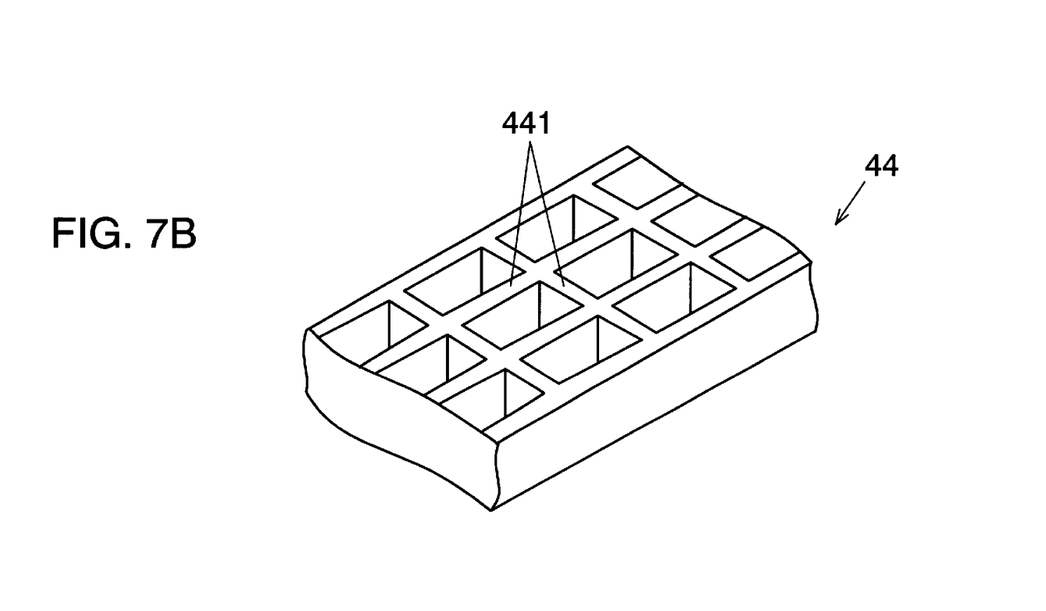
FIG. 7B is a partial perspective view of the squeegee head shown in FIG. 7A.

FIG. 7A is a partial sectional view of a squeegee head of a screen printing apparatus in accordance with the second exemplary embodiment of the present invention. FIG. 7B is a partial perspective view of the squeegee head shown in FIG. 7A. In this second embodiment, paste cell 35 has different elements from the one in the first embodiment, otherwise all the elements remain the same as those of the first embodiment.

In FIG. 7A, partition 44 is disposed in cell 35. As shown in FIG. 7B, partition 44 is formed by assembling a plurality of vertical partitioning plates 441 into a lattice. When cream solder 5 moves downward in cell 35, solder 5 moves in spaces surrounded by partitioning plates 441. Substantial amount of whole cream solder 5 moves downward along vicinity of the surface of plates 441.

Shearing force due to flowing down of solder 5 is applied both to solder 5 being contacted with the surface of plates 441 and to solder 5 existing in an area corresponding to a border layer of the surface vicinity. Solder 5 in this area lowers its viscosity due to the shearing force, and this phenomenon lowers an average viscosity of solder 5 in cell 35. Since partition 44 is formed by assembling numbers of plates 441, it has a large surface area, which effectively prevents solder 5 from being hardened due to pressure in cell 35.

To be more specific, partition 44 has vertical faces contacting with pressurized solder 5 in cell 35, and solder 5 moves down along these contacting faces. As a result, partition 44 functions as a paste-shearing member for shearing solder 5 (paste). This mechanism prevents defective printings due to hardened solder 5.

In this second embodiment, partition 44 in a lattice shape is used; however, it is not limited to the lattice shape as far as any shape can produce shearing in cream solder when the solder moves downward.

A method of screen printing—using the screen printing apparatus in accordance with the second embodiment—is demonstrated hereinafter. The printing method is this: Squeegee head 13 is slid on mask plate 12, so that the paste (cream solder 5) is printed onto substrate 3 via pattern apertures 121 of mask plate 12. This method comprises the following steps:

(a) pressurizing the paste in paste storage (cartridge 31) disposed in head 13;

(b) accommodating the pressurized paste in paste cell 35 of which lower face has opening 37, and bringing the paste into contact with a surface of mask plate 12; and (c) using a paste-shearing member (partition 44) having vertical contacting faces with the paste in cell 35, and flowing the paste downward along the contacting faces, thereby shearing the paste.

This method prevents the paste from being hardened, and defective printings in the screen printing can be avoided.

What is claimed is:

1. A screen printing apparatus for printing paste onto a substrate via pattern apertures of a mask plate by sliding a squeegee head on the mask plate, said squeegee head comprising:

(a) a paste storage for storing paste;

(b) a pressure applying member for applying pressure to the paste in said storage;

(c) a paste cell for accommodating the pressurized paste and bringing the paste into contact with a surface of the mask plate via an opening formed on a lower face of said cell;

(d) a scraper having a slope forming a front wall and a rear wall in a squeegee-moving direction, and forming a brim of the opening with a lower end of said scraper contacted with a surface of the mask plate; and (e) a stationary paste-flow-adjusting member disposed in said cell, for flowing the pressurized paste into the opening in a slant direction by blocking the paste from flowing into a specific area above the opening.

2. The screen printing apparatus of claim 1, wherein said stationary paste-flow-adjusting member has a round sectional view.

3. The screen printing apparatus of claim 1, wherein said stationary paste-flow-adjusting member has a transformed diamond-shape sectional view.

4. The screen printing apparatus of claim 1, wherein said stationary paste-flow-adjusting member forms a triangle-prism.

5. A method of screen printing for printing paste onto a substrate via pattern apertures of a mask plate by sliding a squeegee head on the mask plate, said method comprising the steps of:

(a) pressurizing the paste in a paste storage disposed in the squeegee head;

(b) accommodating the pressurized paste in a paste cell having an opening at a lower face of the paste cell, and bringing the paste into contact with a surface of the mask plate; and (c) blocking the paste from flowing into a specific area above the opening with a stationary paste-flow-adjusting member disposed in said cell, and flowing the paste into the opening in a slant direction.

* * * * *